United States Patent
Sorg et al.

(10) Patent No.: US 8,878,195 B2
(45) Date of Patent: Nov. 4, 2014

(54) SEMICONDUCTOR BASED COMPONENT, RECEPTACLE FOR A SEMICONDUCTOR BASED COMPONENT, AND METHOD FOR PRODUCING A SEMICONDUCTOR BASED COMPONENT

(75) Inventors: Jörg Erich Sorg, Regensburg (DE); Stefan Gruber, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 485 days.

(21) Appl. No.: 12/680,674

(22) PCT Filed: Sep. 12, 2008

(86) PCT No.: PCT/DE2008/001533
§ 371 (c)(1),
(2), (4) Date: Jul. 19, 2010

(87) PCT Pub. No.: WO2009/039829
PCT Pub. Date: Apr. 2, 2009

(65) Prior Publication Data
US 2011/0057218 A1    Mar. 10, 2011

(30) Foreign Application Priority Data
Sep. 28, 2007 (DE) .......................... 10 2007 046 744
Jan. 21, 2008 (DE) .......................... 10 2008 005 345

(51) Int. Cl.
*H01L 27/15* (2006.01)
*H01L 29/26* (2006.01)
(Continued)

(52) U.S. Cl.
CPC ............... *H01L 33/486* (2013.01); *H01L 27/00* (2013.01); *H01L 29/00* (2013.01); *H01L 21/00* (2013.01); *H01L 33/505* (2013.01); *H01L 33/58* (2013.01); *H01L 2924/0002* (2013.01)
USPC ........ 257/79; 257/40; 257/100; 257/E33.059; 257/E33.073; 257/98; 257/99

(58) Field of Classification Search
CPC .......... H01L 21/00; H01L 27/00; H01L 29/00
USPC ......... 257/E25.02, E33.071, E33.072, 40, 79, 257/E33.059, E33.073, 100, 98, 99; 438/26
See application file for complete search history.

(56) References Cited

U.S. PATENT DOCUMENTS 4,837,927 A    6/1989  Savage, Jr.
5,814,870 A *  9/1998  Spaeth .......................... 257/433
(Continued)

FOREIGN PATENT DOCUMENTS

DE    195 27 026    2/1997
DE    196 00 306    4/1997
(Continued)

OTHER PUBLICATIONS

Schnitzer et al., "30% External Quantum Efficiency From Surface Textured, Thin-Film Light-Emitting Diodes", Applied Physics Letters, Oct. 18, 1993, vol. 63, No. 16, pp. 2174-2176.
(Continued)

*Primary Examiner* — Telly Green
(74) *Attorney, Agent, or Firm* — Cozen O'Connor

(57) ABSTRACT

A semiconductor based component with radiation-emitting properties. A glass substrate (1) is provided, which has a first surface (2) and a second surface (1), where a semiconductor element (5) with radiation-emitting properties is accommodated on the first surface (2). Also disclosed is a method for fabricating a semiconductor based component, with the following steps: providing a glass substrate (1), application of a semiconductor element (5) to the first surface (2) of the glass substrate. Also disclosed is a receptacle for a semiconductor based component in which two electrical contact areas (13) are provided, which can be electrically connected to contact areas (7) of the semiconductor based component.

13 Claims, 6 Drawing Sheets

(51) Int. Cl.
*H01L 31/12* (2006.01)
*H01L 33/00* (2010.01)
*H01L 33/48* (2010.01)
*H01L 21/00* (2006.01)
*H01L 33/58* (2010.01)
*H01L 27/00* (2006.01)
*H01L 29/00* (2006.01)
*H01L 33/50* (2010.01)

(56) References Cited

U.S. PATENT DOCUMENTS

| | | | |
|---|---|---|---|
| 6,396,082 | B1 | 5/2002 | Fukasawa et al. |
| 2007/0034887 | A1 | 2/2007 | Pang et al. |
| 2007/0228386 | A1* | 10/2007 | Shie et al. ............... 257/79 |

FOREIGN PATENT DOCUMENTS

| | | |
|---|---|---|
| DE | 103 08 890 | 9/2004 |
| EP | 0 148 608 | 7/1985 |
| EP | 0 911 886 | 10/1998 |
| EP | 1 115 155 | 7/2001 |
| EP | 1 119 058 | 7/2001 |
| JP | 63-262259 | 10/1988 |
| JP | 02-155671 | 6/1990 |
| JP | 04-159519 | 6/1992 |
| JP | 08-072307 | 3/1996 |
| JP | 11-509687 | 8/1999 |
| JP | 2000-022222 | 1/2000 |
| JP | 2000-135814 | 5/2000 |
| JP | 2001-077430 | 3/2001 |
| JP | 2004-341446 | 12/2004 |
| JP | 2005-072129 | 3/2005 |
| JP | 2005-303285 | 10/2005 |
| JP | 2007-095855 | 4/2007 |
| KR | 10-2001-0075353 | 12/2004 |
| TW | M285801 | 1/2006 |
| WO | WO 01/09963 | 2/2001 |
| WO | WO 2006/117710 | 11/2006 |

OTHER PUBLICATIONS

Office Action dated Aug. 21, 2014 issued in the corresponding Korean Patent Application No. 10-2010-7009389.

* cited by examiner

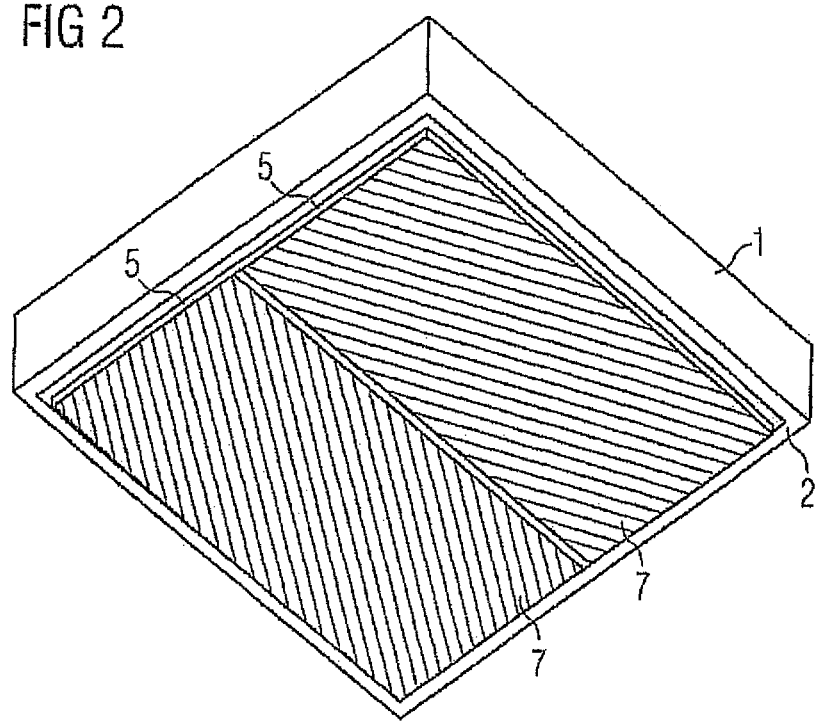
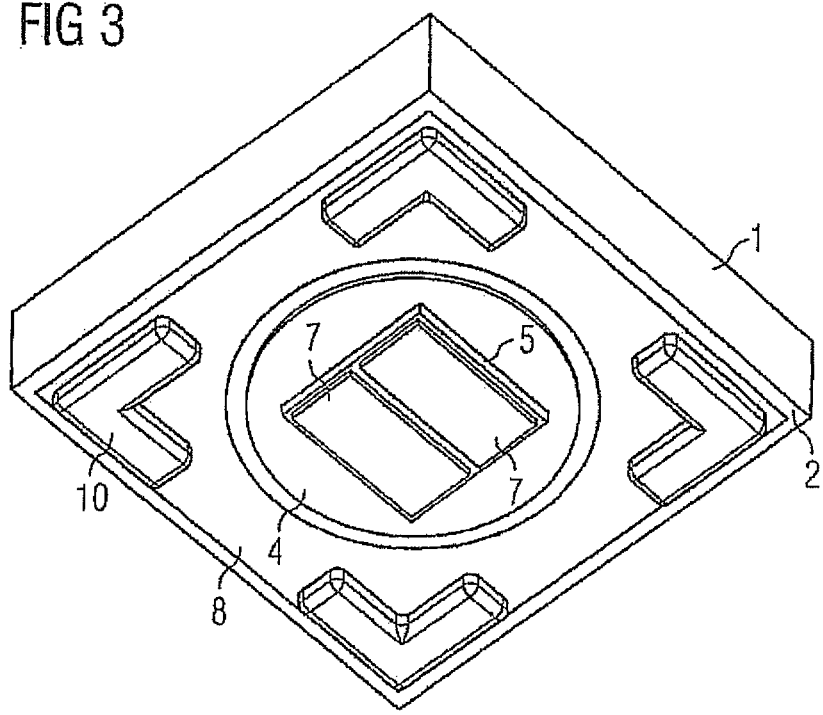

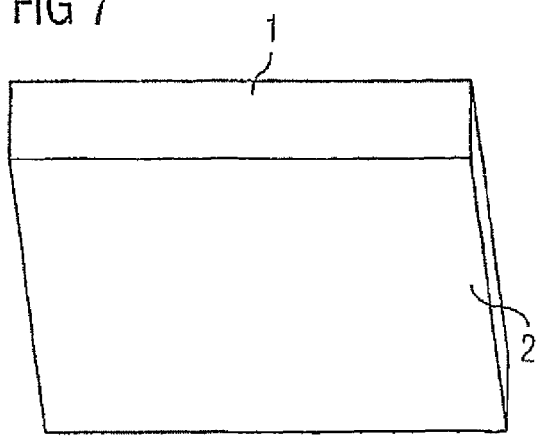
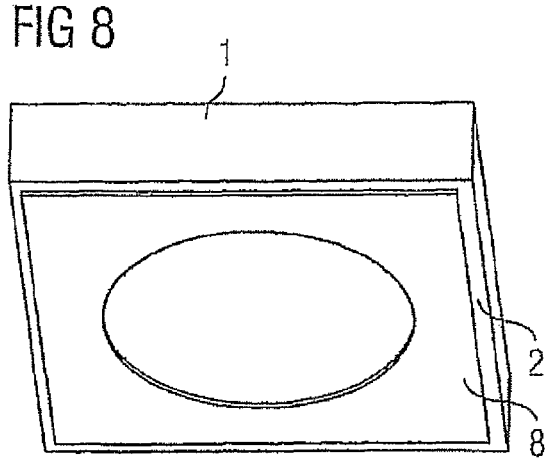
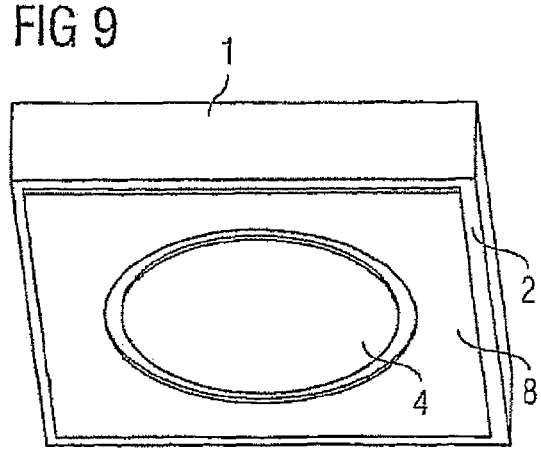

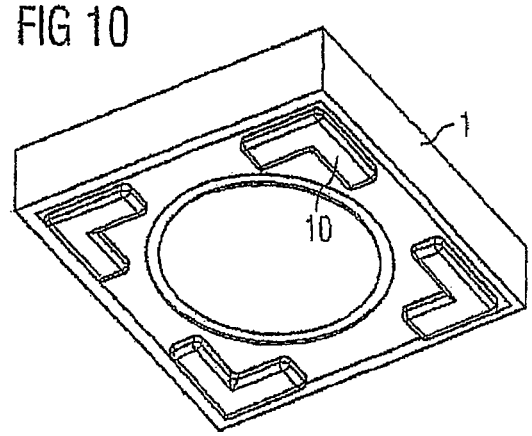
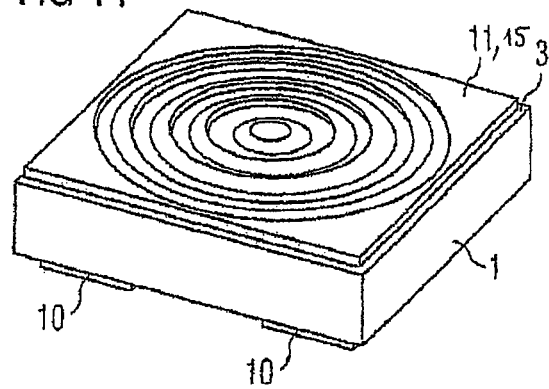
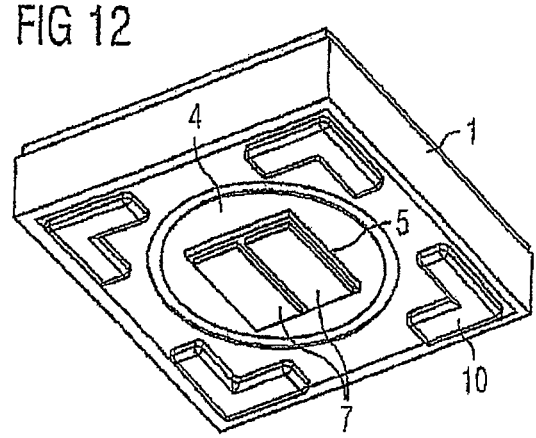

SEMICONDUCTOR BASED COMPONENT, RECEPTACLE FOR A SEMICONDUCTOR BASED COMPONENT, AND METHOD FOR PRODUCING A SEMICONDUCTOR BASED COMPONENT

RELATED APPLICATIONS

This is a U.S. national stage of application No. PCT/DE2008/001533, filed on Sep. 12, 2008.

This patent application claims the priority of the German Patent Applications 10 2007 046 744.5 filed Sep. 28, 2007 and 10 2008 005 345.7 filed Jan. 21, 2008, the disclosure content of both of which is hereby incorporated by reference.

FIELD OF THE INVENTION

This application concerns a semiconductor based component with radiation-emitting properties, a receptacle for a semiconductor based component and a method for making a semiconductor based component.

BACKGROUND OF THE INVENTION

Semiconductor based components with radiation-emitting properties, for example light-emitting diodes, are for the most part made so that a semiconductor element with radiation-emitting properties is mounted or embedded in a housing of a plastic-metal composite or in a ceramic housing. In the process of producing such a semiconductor based component the mounting of the semiconductor element in the housing takes place by means of a soldering operation or a gluing process.

Semiconductor elements with radiation-emitting properties such as thin-film light-emitting diodes, for example, can be categorized in semiconductor elements in which the current flows vertically and in semiconductor elements in which the current flows horizontally. In the case of semiconductor elements in which current flows in the vertical direction, the mounting surface of the semiconductor based component is designed as a single electrical contact. A second electrical contact is arranged on the radiation-emitting side of the semiconductor element. This contact is usually contacted with a bond wire. Semiconductor elements with horizontal current flow are designed so that two electrical contacts are formed on the mounting surface of the semiconductor element.

In particular in the case of a semiconductor element with vertically flowing current, the first and second electrical contacts lie one above the other in the direction of a normal to a main plane of extension of the semiconductor element. In the case of a semiconductor element through which current flows horizontally, the first and second electrical contacts or regions of the first and second electrical contacts are arranged side by side in top view of the main plane.

Expediently, the current flow is in particular not exclusively vertical or horizontal. Rather a lateral spread of current preferably takes place in the case of semiconductor elements with vertical current flow. In the case of semiconductor elements with horizontal current flow the current flow within the semiconductor element in particular has at least in places a component that is parallel to the normal to the main plane of extension.

Regardless of the mode of construction of the semiconductor element itself it is additionally protected against external effects in the housing by embedding it with a transparent resin or another encapsulation material. Static stability and protection against mechanical stress on the semiconductor element is effected by the housing, which surrounds the semiconductor element so as to protect and support it. Because of the surrounding housing the radiation-emitting semiconductor based component per se has a size that far exceeds the size of the semiconductor element itself. This stands in the way of a further potential miniaturization of the component.

SUMMARY OF THE INVENTION

One object of the invention is to provide a semiconductor based component with radiation-emitting properties that enables further miniaturization.

This and other objects are attained in accordance with one aspect of the present invention directed to a semiconductor based component with radiation-emitting properties, comprising a glass substrate, which has a first surface and a second surface, wherein a semiconductor element with radiation-emitting properties is accommodated on the first surface.

In one embodiment, a semiconductor component with radiation-emitting properties is provided with a glass substrate. A semiconductor based component with radiation-emitting properties has a radiation-emitting semiconductor element such as an optoelectronic semiconductor chip. The semiconductor element in particular has a semiconductor layer sequence, for example an epitaxial semiconductor layer sequence that contains an active zone provided for generation of radiation. The active zone expediently contains a pn junction, a double heterostructure and/or a quantum well structure for radiation generation.

The glass substrate essentially has two surfaces, which are arranged opposite and in particular parallel to each other. On a first surface of the glass substrate is arranged a semiconductor element, which has radiation-emitting properties. The semiconductor element is arranged on this surface in such a manner that the direction of radiation is directed toward the glass substrate and further is directed into it. The direction of radiation is here, in particular, understood to mean a direction perpendicular to the main plane of extension of the semiconductor element in which the semiconductor element emits electromagnetic radiation in operation. It is advantageous that the glass substrate forms a supporting element for the semiconductor element.

In one embodiment the semiconductor based component has an essentially square basic shape. In a further development it has an edge length of essentially 3 mm. In another embodiment it has a thickness of essentially 0.85 mm. In another embodiment the lateral dimensions of the component are equal to the lateral dimensions of the glass substrate.

In one embodiment the semiconductor element is designed as a thin-film light-emitting diode. For semiconductor elements with horizontal current flow, in particular for thin-film light-emitting diodes, the glass substrate as support element forms an important advantage, since a growth substrate is separated out during the production process in particular in the case of thin-film light-emitting diodes. During the production process this growth substrate forms the supporting element for the said semiconductor elements. Due to the detachment of the growth substrate during the production process alternative elements that have support properties are required. The glass substrate not only offers support properties, but also protects the semiconductor element from mechanical stress.

A basic principle of a thin-film light-emitting diode is described, for example, in the publication by I. Schnitzer et al., Appl. Phys. Lett. 63 (16), Oct. 18, 1993, pp. 2174-2176, the disclosure content of which in that regard is hereby incorporated by reference. Examples of thin-film light-emitting diodes are described in the publications EP 0905797 A2 and WO 02/13281 A1, the disclosure content of which in this regard is likewise hereby incorporated by reference.

In one embodiment the thin-film light-emitting diode has—less the glass substrate—a thickness in the range of 20 µm or less, in particular in the range of 10 µm or less;

Preferably it is free of a growth substrate. Here, "free of a growth substrate" means that a growth substrate that may be used for growth of a semiconductor layer sequence for the thin-film light-emitting diode is removed from the semiconductor layer sequence or at least is greatly thinned. In particular, it is thinned in such a manner that it is not self-supporting by itself or together with the semiconductor layer sequence. The remainder of the highly thinned growth substrate left behind in particular is unsuitable as such for the function of a growth substrate; and In one embodiment the thin-film light-emitting diode contains at least one semiconductor layer with at least one surface that has an intermixing structure, which in the ideal case leads to nearly ergodic distribution of the light in the semiconductor layer sequence, i.e., it has stochastic scattering behavior that is as ergodic as possible.

In another embodiment a reflective layer is applied or formed on a main surface of a radiation-emitting semiconductor layer sequence of the thin-film light-emitting diode, which in particular is a radiation-generating epitaxial layer sequence, the main surface being remote from the glass substrate and the reflecting layer reflecting at least a part of the electromagnetic radiation generated in the semiconductor layer sequence back to it and in the direction of the glass substrate.

A main surface of the semiconductor element turned toward the glass substrate is, in one embodiment of the component, free of electrical terminal surfaces, also referred to as contacts or contact surfaces. Preferably, two electrical terminal surfaces, which are provided for n-side and for p-side contacting of the semiconductor element, are provided on a side of the semiconductor element turned away from the glass substrate.

It is provided in accordance with one development of the radiation-emitting semiconductor based component that an optical element is arranged on the second surface of the glass substrate. With that the emitted rays of the semiconductor element are emitted through the glass substrate and likewise through the optical element. Various effects can be achieved with the optical element, in each case according to the purpose of the radiation-emitting semiconductor based component and depending on the optical properties of the optical element. With an optical element, designed as a lens, for example, a bundled beam can be formed. With an optical element designed as an optical diffuser the emitted radiation can be scattered. Various properties can be designed in this way in dependence on the respective use of the semiconductor based component. A radiation-emitting semiconductor based component designed in this way is freely scalable with regard to its size. The required width and height dimensions are essentially oriented to the desired optical properties.

For generation of predetermined colors of light, or predetermined wavelengths of the radiation emitted through the semiconductor based component, and in particular mixed-color light, according to one development of the semiconductor based component a conversion layer is arranged between the radiation-emitting semiconductor element and the first surface of the glass substrate. A conversion layer converts the wavelength of the rays passing through it at least for a portion of the rays. Thus, color tones can be generated that cannot be generated alone by the radiation emission of the semiconductor element. Thus, white light, for example, can be generated in a simple and cheap way by combining a semiconductor element that emits blue light with a yellow conversion layer.

According to one development of the semiconductor based component with radiation-emitting properties, the glass substrate is made larger with regard to its first surface than would be necessary to accommodate the semiconductor element and in addition at least one mounting base is provided. The mounting base has a material thickness that is the same as the total thickness of the semiconductor element and is designed to accept mechanical stresses acting on the glass substrate or the semiconductor based component and to transfer them to the mounting site. With that, in a mounted state, the semiconductor element is protected from mechanical stresses all around. Another advantage of this development is given by the fact that even in an unmounted state the semiconductor element is somewhat protected against abrasive stresses.

In accordance with one development of the semiconductor based component with radiation-emitting properties the areas not covered by the semiconductor element are covered with a mirror in order to avoid scattered light losses. In one embodiment this mirror is applied directly to the first surface of the glass substrate and covers only the areas of the first surface not covered by the semiconductor element. Thus, apart from exceptions resulting from the fabrication technology, surfaces that are either radiation-emitting or radiation reflecting are formed on the glass substrate. And the radiation-emitting surfaces are formed by the semiconductor element and the radiation-reflecting surfaces are formed by the mirror.

Further, a receptacle unit, hereinafter called receptacle, is specified; which is intended to hold the semiconductor based component that is designed in accordance with the principle described above.

The receptacle has two electrical contacts, which are made connectable. Thus, electrical signals or electrical energy can be supplied to a semiconductor based component accommodated by the receptacle. The electrical contacts in one embodiment are made equal to the contact elements of the semiconductor element in size and two-dimensional design. Thus, an electrical contact can be made between the semiconductor element and the receptacle by gluing with a conductive glue or by soldering. The contact elements are surrounded with at least one base receptacle, on which the at least one mounting base can be accommodated. The base receptacle is electrically neutral and accordingly does not form an electrical connection with the electrical contacts.

Another aspect of the invention is directed to a method for fabricating a semiconductor based component is specified. The method includes the following steps.

One step comprises providing a glass substrate. A subsequent second step comprises the application of a semiconductor element to a first surface and the application of an optical element to a second surface of the glass substrate.

The method can be employed on a plurality of glass substrates at the same time, where a glass wafer is provided on which a plurality of semiconductor based components is formed in parallel. One process step then comprises the separation of the semiconductor based components of the entire glass wafer.

One development of the method provides for the fabrication of a semiconductor based component with radiation-emitting properties that emits radiation of a predetermined wavelength or mixed color light, for example white light. For example, to generate wavelengths that cannot be generated by means of the known semiconductor materials alone, according to a further development a conversion layer is applied to the first surface of the glass substrate before application of the semiconductor element. A screen printing process or a template printing process is preferably used here.

For a semiconductor element whose two-dimensional extension is smaller than the first surface of the glass substrate application of a mirror layer by means of a phototechnically influenced sputtering or evaporation process is provided. Here the first surface of the glass substrate is pretreated by phototechnological means, in particular by means of a photolithographic process, so that only the areas which remain uncovered by the semiconductor element and a possibly later applied conversion layer are treatable by means of the sputtering or evaporation process.

The optical element is introduced on the second surface of the glass substrate in an aging- and temperature-stable layer, preferably of silicone.

The invention is explained in more detail below by means of two exemplary embodiments and with the help of 12 figures.

BRIEF DESCRIPTION OF THE DRAWINGS

FIG. 2 shows the semiconductor based component in a second embodiment in a schematic perspective view, FIG. 3 shows the semiconductor based component of the first embodiment in a schematic perspective view, FIGS. 7 to 12 show schematic perspective views of individual process steps of an exemplary embodiment of a process for fabricating the semiconductor based component of the first embodiment.

DETAILED DESCRIPTION OF THE DRAWINGS

Elements with the same functions are indicated with the same reference symbols throughout the figures. The figures and the size relationships of the elements shown in the figures should not be interpreted as true to scale. Rather individual elements may be shown exaggerated for better representation and/or for better understanding.

Figure 1:
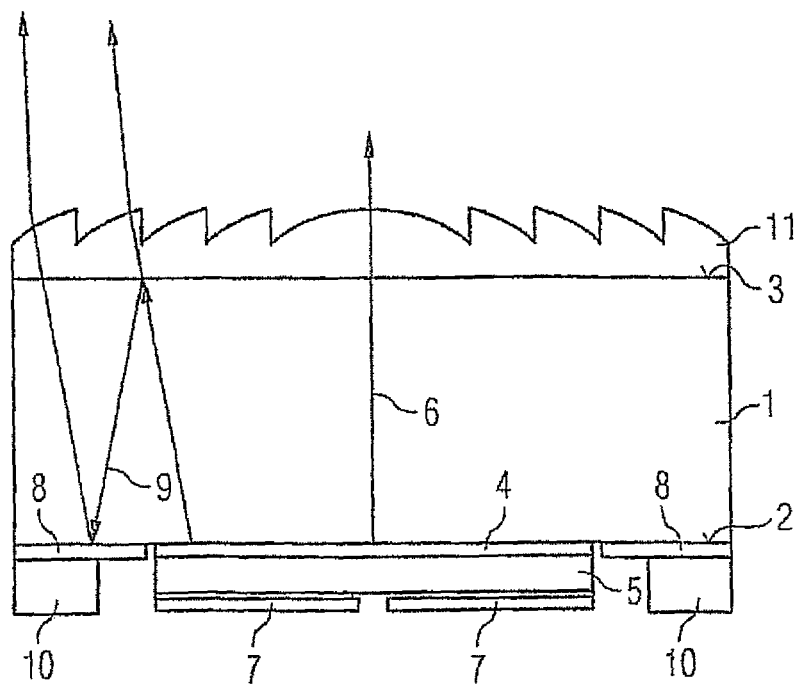
FIG. 1 shows the semiconductor based component in a first embodiment in a schematic cross-sectional view.

FIG. 1 shows an exemplary embodiment of the semiconductor based component with radiation-emitting properties in accordance with the principle described above. A transparent glass substrate 1 is provided as supporting element. This glass substrate 1 has a first surface 2 and a second surface 3. To the first surface 2 is applied a conversion layer 4, on which a semiconductor element 5 is accommodated. The semiconductor element 5 has radiation-emitting properties and is arranged on the conversion layer 4 in such manner that the direction of radiation 6 is directed through the conversion layer 4 and likewise through the glass substrate 1.

Preferably, the semiconductor element 5 is designed as a thin-film light-emitting diode and, on the surface remote from glass substrate 1, comprises at least two electrically conducting contact surfaces 7 via which the semiconductor element 5 is supplied with electrical energy. In the illustrated exemplary embodiment the semiconductor element 5 does not cover the entire first surface 2 of the glass substrate 1. The remaining regions of the first surface 2 of the glass substrate 1 are covered with a mirror 8. The mirror 8 causes portions of scattered light 9, which are reflected in the direction of the first surface 2, to be directed, at mirror 8, back in the direction of radiation 6 and thus in the direction of the second surface 3. With this scattered light loss is reduced.

Mounting bases 10 are made at the outer edges of the first surface 2. Through these bases the semiconductor based component can be stably positioned in a receptacle. The mounting bases 10 are designed to have such a shape that the entire semiconductor based component is supported by the mounting bases 10 at the mounting site. In this way mechanical stresses on semiconductor element 5 are avoided.

An optical element 11 is accommodated on the second surface 3 of the glass substrate. The exemplary embodiment shows the optical element 11 in the form of a Fresnel lens. A bundled beam can be generated by means of the optical element 11 in the form of a Fresnel lens. The semiconductor based component, however, is not limited to this exemplary embodiment, rather optical elements with other properties can be used, for example an optical diffuser. This is dependent only on the purpose of the semiconductor based component.

FIG. 2 shows the semiconductor based component with radiation-emitting properties in a second embodiment, in which the semiconductor element 5 occupies nearly the complete first surface 2 of the glass substrate. This embodiment is formed when the glass substrate 1 and its two-dimensional extension at the first surface 2 nearly corresponds to the two-dimensional extension of the semiconductor element 5. In contrast to the first exemplary embodiment from FIG. 1 in this exemplary embodiment the arrangement of mounting bases 10 or the arrangement of a mirror 8 is not necessary.

FIG. 3 shows the first exemplary embodiment of the semiconductor based component in a perspective view. The direction of viewing is toward the first surface 2 of the semiconductor based component.

The semiconductor element 5, the conversion layer 4, the mirror 8 and the mounting bases 10 are arranged on this surface. Centrally on the first surface 2 of glass substrate 1 the conversion layer 4 is arranged following a round shape, on which conversion layer 4 the semiconductor element 5 is arranged, preferably in the middle. The semiconductor element 5 in turn has electrically conducting contact surfaces 7, which are intended to supply the semiconductor element 5 with electrical energy at the mounting site. Surrounding the circular conversion layer 4 a mirror 8 is applied to avoid scattered light losses.

The glass substrate 1 is preferably made in a square basic shape and comprises at least one mounting base 10 in each corner region of the first surface 2 of the glass substrate 1. The semiconductor based component is secured at a mounting site by means of the mounting bases 10. Mechanical forces that act on the semiconductor based component at a mounting site are shunted by the mounting base 10 so that the semiconductor element 5 is protected against mechanical stress. The semiconductor based component shown in FIG. 3 has an essentially square base shape with an edge length of essentially 3 mm and a thickness of essentially 0.85 mm. However, the principle described above is not limited to these external dimensions. Rather one of the advantages is to be seen in the fact that the size of an individual semiconductor based component according to the principle described above is determined only by the requirements on the optical properties.

Figure 4:
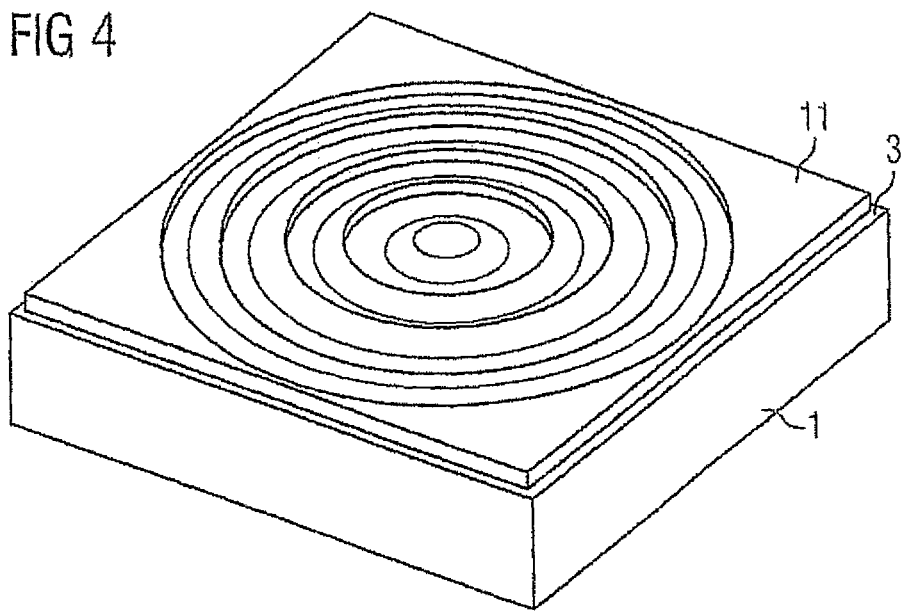
FIG. 4 shows the semiconductor based component of the first embodiment in a schematic perspective view.

FIG. 4 shows the first exemplary embodiment, which is also shown in FIGS. 1 and 3 in a perspective view. The direction of viewing in this drawing is aimed at the second surface 3 of the glass substrate 1. The optical element 11 is accommodated on the second surface 3. In the exemplary embodiment the optical element 11 is made as a lens. The exemplary embodiment shows a Fresnel lens.

Figure 5:
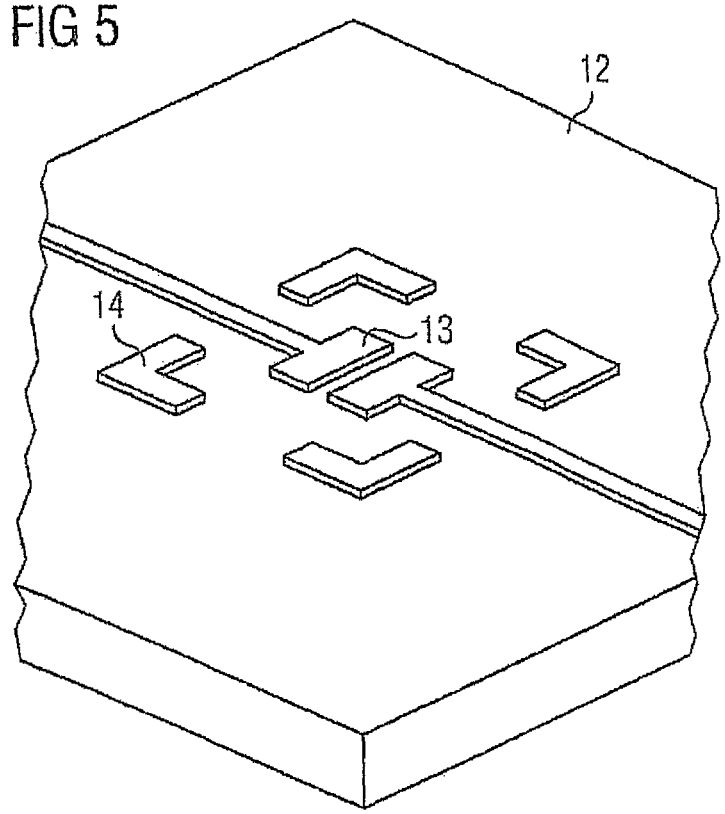
FIG. 5 shows a section of a receptacle for the semiconductor based component in accordance with the first embodiment in a schematic perspective view.

FIG. 5 shows an exemplary embodiment of a receptacle for a semiconductor based component in accordance with exemplary embodiments from FIG. 1, 3 or 4, in which at least two electrically conducting contacts 13 are arranged on a circuit board 12. Electrical signals or electric energy can be allocated to these contacts by means of conducting supply paths. Thus, electrical connection of the electrical contacts 7 of the semiconductor element 5 in installed state of the semiconductor based component is possible. The semiconductor based component and the receptacle are matched to each other, so that the electrical contact surfaces 7 of semiconductor element 5 interact with the electrical contacts 13. Base receptacles 14, which interact with the mounting bases 10 of the semiconductor based component, are arranged on the receptacle. Accordingly, the electrical contacts 13 are arranged centrally in the receptacle and are surrounded by base receptacles 14 in such manner that each mounting base 10 can be held on a base receptacle 14 by a gluing operation or a soldering operation or other force processes.

Figure 6:
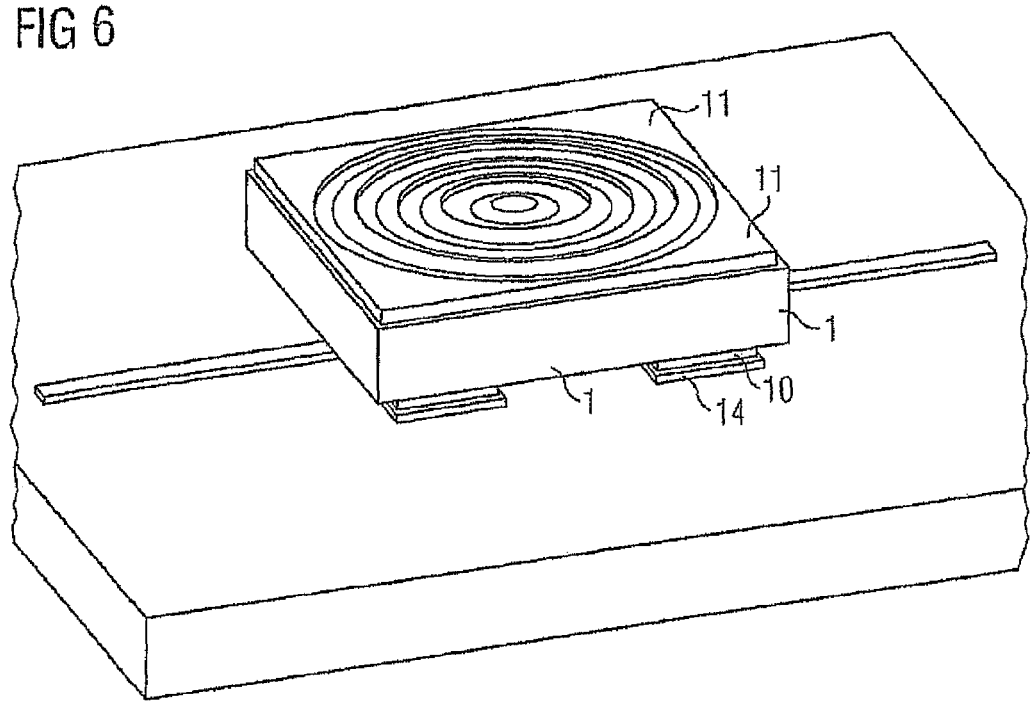
FIG. 6 shows the semiconductor based component in accordance with the first embodiment in the receptacle in a schematic perspective view.

FIG. 6 shows a semiconductor based component arranged on the receptacle in a perspective drawing. Each mounting base 10 is arranged on one base receptacle 14.

FIGS. 7 to 12 describe, in individual process steps, a fabrication process using as an example a single semiconductor based component in accordance with the principle described above and the first exemplary embodiment described above.

FIG. 7 shows a transparent glass substrate 1, which has a square basic shape. This already describes the shape that a single semiconductor based component has. In particular, the lateral dimensions of the component are the same as the lateral dimensions of the glass substrate.

An optimized production process for fabrication of the above described semiconductor based radiation-emitting components provides for a plurality of such glass substrates to be processed at the same time on a glass wafer. The glass wafer is then separated in a predetermined partial step of the fabrication process, so that individual elements are formed. The process is shown by means of a single element for better understanding of the fabrication process.

Starting with the glass substrate 1, as shown in FIG. 8, a mirror layer is applied to the first surface 2 of the glass substrate 1 to form the mirror 8, by a sputtering process or an evaporation process. This process is preceded by a photolithographic process in order to define surface regions that should not receive a mirror coating.

Then, as shown in FIG. 9, a conversion layer 4 is applied to the first surface 2 of glass substrate 1, for example on a partial region of the first surface 2. The conversion layer 4 is applied by a screen printing or stencil printing process. In the present case, a central region of the first surface 2 that is not covered by mirror 8 is coated with the conversion layer 4. The mirror 8 is not covered by the conversion layer 8 in the present case.

This is followed by application of the mounting bases 10, each at a corner region of the glass substrate, as shown in FIG. 10, by means of a galvanic process, the galvanic process being, for example, photolithographically supported. The mounting bases 8 are applied, for example, on edge regions of minor 8. In a subsequent process step, shown in FIG. 11, the second surface 3 is now provided with the optical element 11. The optical element 11 is introduced in an aging- and temperature-stable layer 15, for example of silicone.

The step shown in FIG. 12 comprises the application of the semiconductor element 5 to the conversion layer 4. The semiconductor element 5, which is made as a thin-film light-emitting diode, already comprises contact surfaces 7 for connection and for formation of electrical contact for electrical energy supplied to the semiconductor element. The thin-film light-emitting diode is produced in a further fabrication process and in the last described process step is arranged on the glass substrate 1.

The invention claimed is:

1. A radiation-emitting device comprising a receptacle and a semiconductor based component arranged in the receptacle, wherein the semiconductor based component comprises:
   a glass substrate having a first surface and a second surface, wherein the first surface and the second surface are arranged opposite to each other;
   a semiconductor element with radiation-emitting properties on the first surface and having at least two electrically conducting contact areas on the side turned away from the first surface of the glass substrate;
   a plurality of separate mounting bases arranged on the first surface of the glass substrate; and
   a conversion layer arranged between the first surface and the radiation-emitting semiconductor element, and
   wherein the receptacle comprises two electrical contacts, which are wirelessly electrically connected to the contact areas, and a plurality of base receptacles configured so that the mounting bases can be held thereon.

2. The radiation-emitting device as in claim 1, wherein an optical element is accommodated on the second surface.

3. The radiation-emitting device as in claim 1, wherein the first surface is covered by the semiconductor element and a mirror.

4. The radiation-emitting device as in claim 1, wherein the plurality of separate mounting bases are configured to transfer mechanical stresses acting on the semiconductor based component to the mounting site to protect the semiconductor element.

5. The radiation-emitting device as in claim 1, wherein the contacts are arranged centrally in the receptacle and are surrounded by the base receptacles.

6. A method for fabricating a radiation-emitting device comprising the steps of:
   providing a glass substrate, which has a first surface and a second surface, wherein the first surface and the second surface are arranged opposite to each other;
   applying a semiconductor element to the first surface of the glass substrate;
   applying a plurality of separate mounting bases on the first surface of the glass substrate, wherein the plurality of separate mounting bases is adapted to secure the semiconductor based component at a mounting site; and
   arranging a conversion layer between the first surface and the semiconductor element,
   wherein the semiconductor element is configured to be contacted wirelessly from the outside of the semiconductor based component.

7. The method as in claim 6, comprising applying a minor layer to the first surface.

8. The method as in claim 6, comprising applying an optical element to the second surface of the glass substrate.

9. The method as in claim 6, comprising applying a conversion layer between the first surface of the glass substrate and the semiconductor element.

10. The method as in claim 6, wherein the minor layer is applied by means of a phototechnologically influenced sputtering or evaporation process and/or the conversion layer is applied by means of a screen printing or template printing process.

11. The method as in claim 6, wherein at least one mounting base is applied to the first surface of the glass substrate by means of a galvanic process.

12. The method as in claim 8, wherein the optical element is introduced in an aging- and temperature-stable layer.

13. The method as in claim 12, wherein the aging- and temperature-stable layer is made of silicone.

* * * * *

UNITED STATES PATENT AND TRADEMARK OFFICE
CERTIFICATE OF CORRECTION

| | |
|---|---|
| PATENT NO. | : 8,878,195 B2 |
| APPLICATION NO. | : 12/680674 |
| DATED | : November 4, 2014 |
| INVENTOR(S) | : Sorg et al. |

It is certified that error appears in the above-identified patent and that said Letters Patent is hereby corrected as shown below:

In the Claims

Column 8, Line 56-57, claim 7 should read:

--7. The method as in claim 6, comprising applying a mirror layer to the first surface.--.

Column 8, Line 63-67, claim 10 should read:

--10. The method as in claim 6, wherein the mirror layer is applied by means of a phototechnologically influenced sputtering or evaporation process and/or the conversion layer is applied by means of a screen printing or template printing process.--.

Signed and Sealed this
Twenty-fourth Day of February, 2015

Michelle K. Lee
*Deputy Director of the United States Patent and Trademark Office*